US007905195B2

(12) United States Patent
Yamasaki et al.

(10) Patent No.: US 7,905,195 B2
(45) Date of Patent: Mar. 15, 2011

(54) FLOATING-TYPE SUBSTRATE CONVEYING AND PROCESSING APPARATUS

(75) Inventors: Tsuyoshi Yamasaki, Koshi (JP); Toshifumi Inamasu, Koshi (JP); Kenya Shinozaki, Koshi (JP); Kimio Motoda, Koshi (JP)

(73) Assignee: Tokyo Electron Limited, Tokyo-To (JP)

( * ) Notice: Subject to any disclaimer, the term of this patent is extended or adjusted under 35 U.S.C. 154(b) by 1056 days.

(21) Appl. No.: 11/486,005

(22) Filed: Jul. 14, 2006

(65) Prior Publication Data

US 2007/0017442 A1    Jan. 25, 2007

(30) Foreign Application Priority Data

Jul. 19, 2005    (JP) ................................ 2005-208851

(51) Int. Cl.
*B05C 5/02*    (2006.01)
(52) U.S. Cl. ...... 118/300; 118/305; 118/500; 198/689.1; 198/493; 198/817; 406/86; 406/88; 414/676
(58) Field of Classification Search .................. 118/300, 118/305, 500; 198/689.1, 493, 817; 34/640, 34/658; 414/676; 406/86, 88
See application file for complete search history.

(56) References Cited

U.S. PATENT DOCUMENTS

| | | | | |
|---|---|---|---|---|
| 5,177,878 | A | * | 1/1993 | Visser ................................ 34/92 |
| 5,492,566 | A | * | 2/1996 | Sumnitsch .................... 118/500 |
| 7,604,439 | B2 | * | 10/2009 | Yassour et al. .................. 406/88 |
| 7,648,579 | B2 | * | 1/2010 | Goodman et al. ............. 118/730 |

FOREIGN PATENT DOCUMENTS

| | | |
|---|---|---|
| JP | 10-156255 | 6/1998 |
| JP | 2004-273574 | 9/2004 |
| JP | 2005-52821 | 3/2005 |
| JP | 2005-132626 | 5/2005 |
| JP | 2005-244155 | 9/2005 |

* cited by examiner

*Primary Examiner* — Laura Edwards
(74) *Attorney, Agent, or Firm* — Oblon, Spivak, McClelland, Maier & Neustadt, L.L.P.

(57) ABSTRACT

The present invention provides a floating-type substrate conveying and processing apparatus that floats a substrate to be processed. The device includes a floating stage that floats the substrate, a liquid supplier placed above the floating stage via the substrate to supply a process liquid to a surface of the substrate, and a moving mechanism for holding the substrate as detachable at opposite ends of the substrate, at a floating height of the substrate, and for moving the substrate on the floating stage. The floating stage is formed of a porous member and has a plurality of suction apertures airtightly defined in a porous portion of the porous member. The floating stage injects gas through the porous portion and sucks gas through the suction apertures to float the substrate placed on the porous portion.

5 Claims, 12 Drawing Sheets

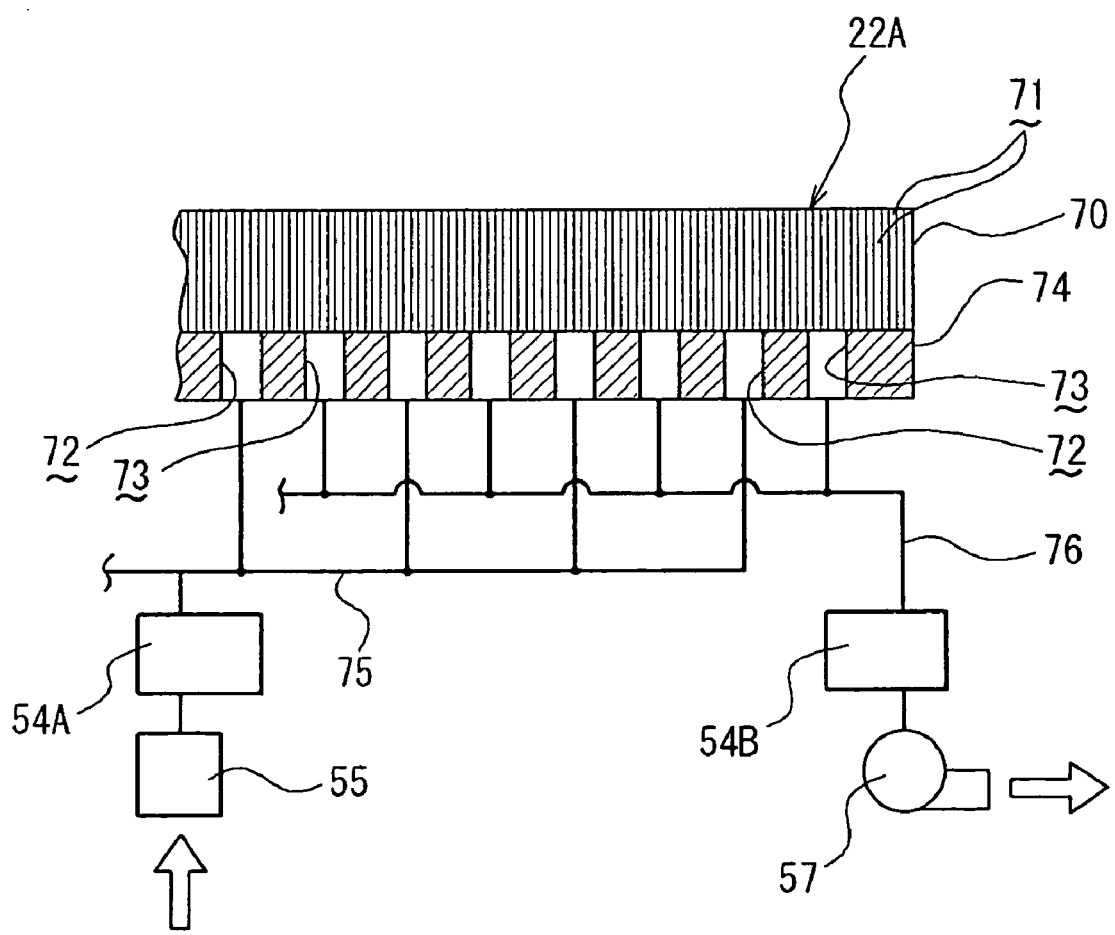
F I G. 8

FLOATING-TYPE SUBSTRATE CONVEYING AND PROCESSING APPARATUS

BACKGROUND OF THE INVENTION

The present invention relates to a floating-type substrate conveying and processing apparatus that supplies a process liquid, for example, a resist solution to a substrate to be processed, for example, an LCD glass substrate, to process the substrate.

In general, the following series of steps are executed to manufacture a semiconductor device: applying a resist liquid to an LCD glass substrate or the like (hereinafter referred to as a substrate), a substrate to be processed, to form a resist film, using a photolithography technique to scale dawn a circuit pattern and transfer it to the resist film, developing the transferred circuit pattern, and subsequently removing the resist film from the substrate.

For example, a known method for forming a resist film carries out a coating process while moving a resist supply nozzle and a rectangular substrate in parallel relative to each other in a direction orthogonal to the direction in which a resist liquid is ejected, the resist supply nozzle ejecting the resist liquid in band form, the resist liquid being obtained by dissolving a photosensitive resin into a solvent (for example, Japanese Patent Laid-Open No. 10-156255).

In this method, the resist liquid is ejected (supplied) in band form so that the liquid spans the opposite sides of the substrate. A resist film can thus be uniformly formed all over the surface of the rectangular substrate.

However, the above technique uses a structure that either the resist supply nozzle, erected above the substrate, or a stage, which holds the substrate in a horizontal position is moved. This disadvantageously results in a large, complicated apparatus and requires a large quantity of energy to move the massive resist supply nozzle or stage. Further, the massive resist supply nozzle or stage must be returned to its initial position after one process and then moved again for another process. This disadvantageously reduces process efficiency.

Through their wholehearted efforts, the inventors of the present invention have developed a floating-type substrate conveying and processing apparatus that injects gas to a substrate or uses both gas injection and suction to float and covey a substrate, while feeding a process liquid in band form to the surface of the substrate to process the substrate (for example, Japanese Patent Application No. 2004-218156).

This floating-type substrate conveying and processing apparatus is small and simplified and can improve process efficiency.

However, in the conventional method using gas to float and hold a substrate, the gas is injected from gas injection apertures arranged in a substrate conveying direction and a direction orthogonal to the conveying direction, that is, in vertical and horizontal directions, or from the gas injection apertures while sucking the gas through suction apertures. Thus, during conveyance of the substrate, a gap may be created between sections in which gas is being injected and other sections in which gas is not injected or between a sections in which gas is being sucked and other sections in which gas is not sucked. This makes it difficult to maintain the uniform floating height of the substrate, to stably hold the floating substrate, and to suppress vibration of the substrate being conveyed.

SUMMARY OF THE INVENTION

The present invention was made in view of the above circumstances. An object of the present invention is to provide a floating-type substrate conveying and processing apparatus which maintains the uniform floating height of a substrate and which stably holds the floating substrate, and suppresses vibration of the substrate being conveyed.

The present invention provides a floating-type substrate conveying and processing apparatus comprising: a floating stage formed of a porous member and having a plurality of suction apertures airtightly defined in a porous portion of the porous member, the floating stage injecting gas through the porous portion and sucking gas through the suction apertures to float a substrate to be processed placed on the porous portion; a process liquid supplier placed above the floating stage via the substrate to supply a process liquid to a surface of the substrate; and a moving mechanism for holding the substrate as detachable at opposite ends of the substrate, at a floating height of the substrate, and for moving the substrate on the floating stage.

Moreover, the present invention provides a floating-type substrate conveying and processing apparatus comprising: a floating stage including a porous plate having a plurality of aligned apertures, and a channel plate disposed below a bottom surface of the porous plate and having a plurality of alternately arranged gas supply channel grooves and gas suction channel grooves each having a groove width larger than the diameter of each of the apertures, the floating stage injecting gas via the gas supply channel grooves and sucking gas via the gas suction channel grooves to float a substrate to be processed placed on the porous portion; a process liquid supplier placed above the floating stage via the substrate to supply a process liquid to a surface of the substrate; and a moving mechanism for holding the substrate as detachable at opposite ends of the substrate, at a floating height of the substrate, and for moving the substrate on the floating stage.

Furthermore, the present invention provides a floating-type substrate conveying and processing apparatus comprising: a floating stage including a stage main body having a surface plate with a plurality of first holes, an intermediate plate disposed below a bottom surface of the surface plate via a first space and located immediately below each of the first holes, the intermediate plate having second holes smaller than the first holes, and a lower plate disposed below a bottom surface of the intermediate plate via a second space, the floating stage further including porous members each having a plurality of aligned apertures smaller than the second holes, a head portion that is fitted into the corresponding first hole, and a leg portion located below the head portion and which is airtightly fitted into the corresponding second hole, the floating stage injecting gas through the porous members and sucking gas through the porous members to float a substrate to be processed placed on the surface plate; a process liquid supplier placed above the floating stage via the substrate to supply a process liquid to a surface of the substrate; and a moving mechanism for holding the substrate as detachable at opposite ends of the substrate, at a floating height of the substrate, and for moving the substrate on the floating stage.

BRIEF DESCRIPTION OF THE DRAWINGS

FIG. 8 is a schematic sectional view showing a second embodiment of a floating-type substrate conveying and processing apparatus according to the present invention;

DETAILED DESCRIPTION OF THE INVENTION

The best embodiment of the present invention will be described below in detail with reference to the accompanying drawings. In the description below, a floating-type substrate conveying and processing apparatus according to the present invention is applied to a resist applying process apparatus in a resist applying and developing apparatus for LCD glass substrates.

Figure 1:
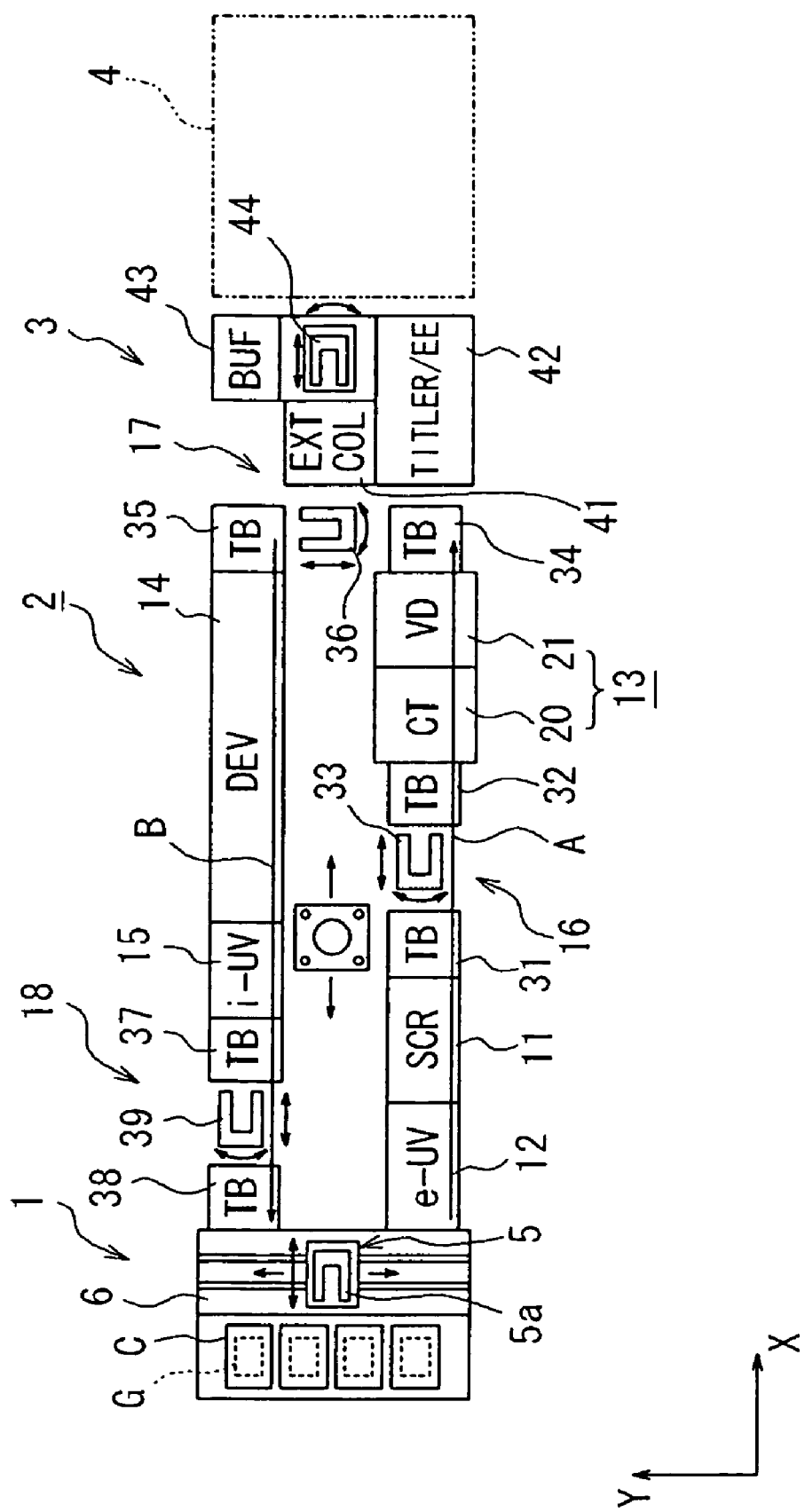
FIG. 1 is a schematic plan view showing a resist applying and developing apparatus for LCD glass substrates to which a floating-type substrate conveying and processing apparatus according to the present invention is applied.

As shown in FIG. 1, the resist applying and developing apparatus includes: a loading and unloading section 1 in which cassettes C are placed each of which accommodates plural LCD glass substrates G (hereinafter referred to as substrates G) to be processed; a processing section 2 including plural processing units that executes a series of processes including resist application and development, on the substrate G; and an interface section 3 that delivers and receives the substrate G to and from an exposure device 4. The loading and unloading section 1 and interface section 3 are arranged at the respective ends of the processing section 2. In FIG. 1, the longitudinal direction of the resist applying and developing apparatus is defined as a direction X. A direction orthogonal to the direction X in the plan view is defined as a direction Y.

The loading and unloading section 1 includes a conveying mechanism 5 for carrying out loading and unloading of the substrate G between the cassettes C and the processing section 2. The loading and unloading section 1 carries out loading and unloading of the cassettes C from or to an external apparatus. The conveying mechanism 5 has a conveying arm 5a and is movable on a conveying path 6 provided along the direction Y, in which the cassettes C are arranged. The conveying arm 5a carries out loading and unloading of the substrate G between the cassettes C and the processing section 2.

The processing section 2 has two parallel conveying lines A and B basically extending in the direction X to convey the substrate G. A scrub washing unit (SCR) 11, a first thermal-treatment unit section 16, a resist processing unit 13, and a second thermal-treatment unit section 17 are arranged in this order along the conveying line A from the loading and unloading section 1 toward the interface section 3. A second thermal-treatment unit section 17, a developing unit (DEV) 14, an i-ray UV irradiating unit (I-UV) 15, and a third thermal-treatment unit 18 are arranged in this order along the conveying line B from the interface section 3 toward the loading and unloading section 1. An excimer UV irradiation unit (e-UV) 12 is provided on a part of the scrub washing unit (SCR) 11. In this case, the excimer UV irradiation unit (e-UV) 12 removes organic matter from the substrate G before scrub washing. The i-ray UV irradiation unit (i-UV) 15 executes a decoloring process for development.

The first thermal-treatment unit section 16 has two thermal-treatment unit blocks (TB) 31 and 32 in each of which thermal process units that thermally treat the substrate G are stacked. The thermal-treatment unit block (TB) 31 is provided closer to the scrub washing unit (SCR) 11. The thermal-treatment unit block (TB) 32 is provided closer to the resist processing unit 13. A first conveying mechanism 33 is provided between the two thermal-treatment unit blocks (TB) 31 and 32.

The second thermal-treatment unit section 17 has two thermal-treatment unit blocks (TB) 34 and 35 in each of which thermal process units that thermally treat the substrate G are stacked. The thermal-treatment unit block (TB) 34 is provided closer to the resist processing unit 13. The thermal-treatment unit block (TB) 35 is provided closer to the developing unit 14. A second conveying mechanism 36 is provided between the two thermal-treatment unit blocks (TB) 34 and 35.

The third thermal-treatment unit section 18 has two thermal-treatment unit blocks (TB) 37 and 38 in each of which thermal process units that thermally treat the substrate G are stacked. The thermal-treatment unit block (TB) 37 is provided closer to the developing unit (DEV) 14. The thermal-treatment unit block (TB) 38 is provided closer to the loading and unloading section 1. A third conveying mechanism 39 is provided between the two thermal-treatment unit blocks (TB) 37 and 38.

An extension cooling stage (EXT•COL) 41, an external apparatus block 42, a buffer stage (BUF) 43, and a fourth conveying mechanism 44 are disposed in the interface portion 3, with a peripheral exposure device (EE) and a titler being stacked in the external apparatus block 42.

In the interface portion 3 thus configured, the substrate G is conveyed to the extension cooling stage (EXT•COL) 41 by the second conveying mechanism 36. The substrate G is then conveyed to the peripheral exposure device (EE) in the external apparatus block 42 by the fourth conveying mechanism 44. The substrate G is thus exposed to remove peripheral resist and then conveyed to the exposure device 4 by the fourth conveying mechanism 44. A resist film on the substrate G is thus exposed to form a predetermined pattern. The substrate G may be accommodated in a buffer stage (BUF) 43 before being conveyed to the exposure device 4. After the exposure has been finished, the substrate G is conveyed to the titler in the external apparatus block 42 by the fourth conveying mechanism 44. Predetermined information is then stored in the substrate G, which is then placed on the extension cooling stage (EXT·COL) 41. The substrate G is then conveyed to the processing section 2 again.

The resist process unit 13 includes a resist applying apparatus 20 to which the floating-type substrate conveying and processing apparatus according to the present invention is applied, and a vacuum drying device (VD) 21 that dries a resist film formed on the substrate G by the resist applying apparatus 20, in a vacuum chamber (not shown).

Now, description will be given of the resist applying apparatus 20 to which the flowing substrate conveying process device according to the present invention is applied.

First Embodiment

Figure 2:
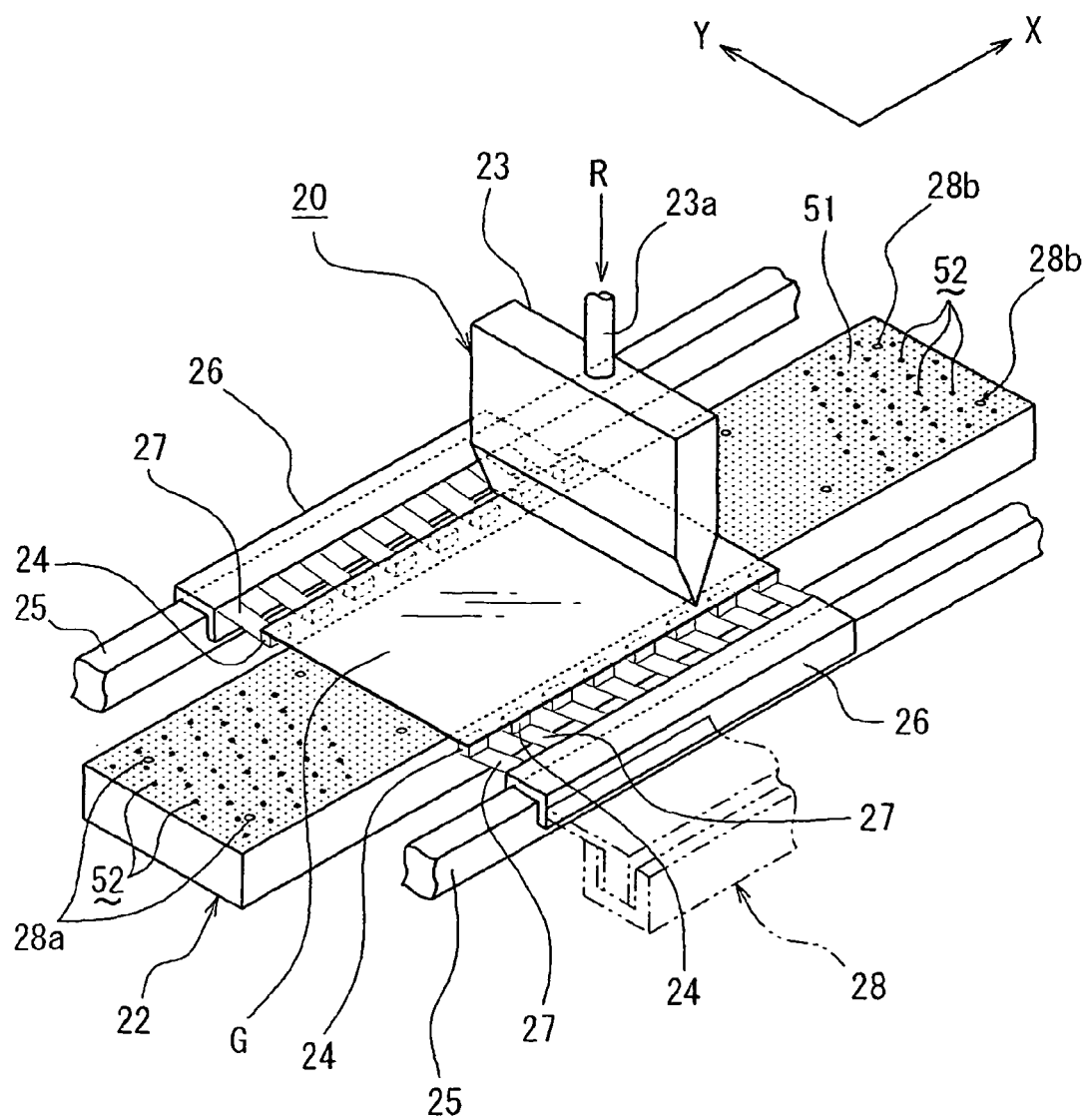
FIG. 2 is a schematic perspective view showing a first embodiment of a resist applying apparatus to which the floating-type substrate conveying and processing apparatus is applied.
Figure 3:
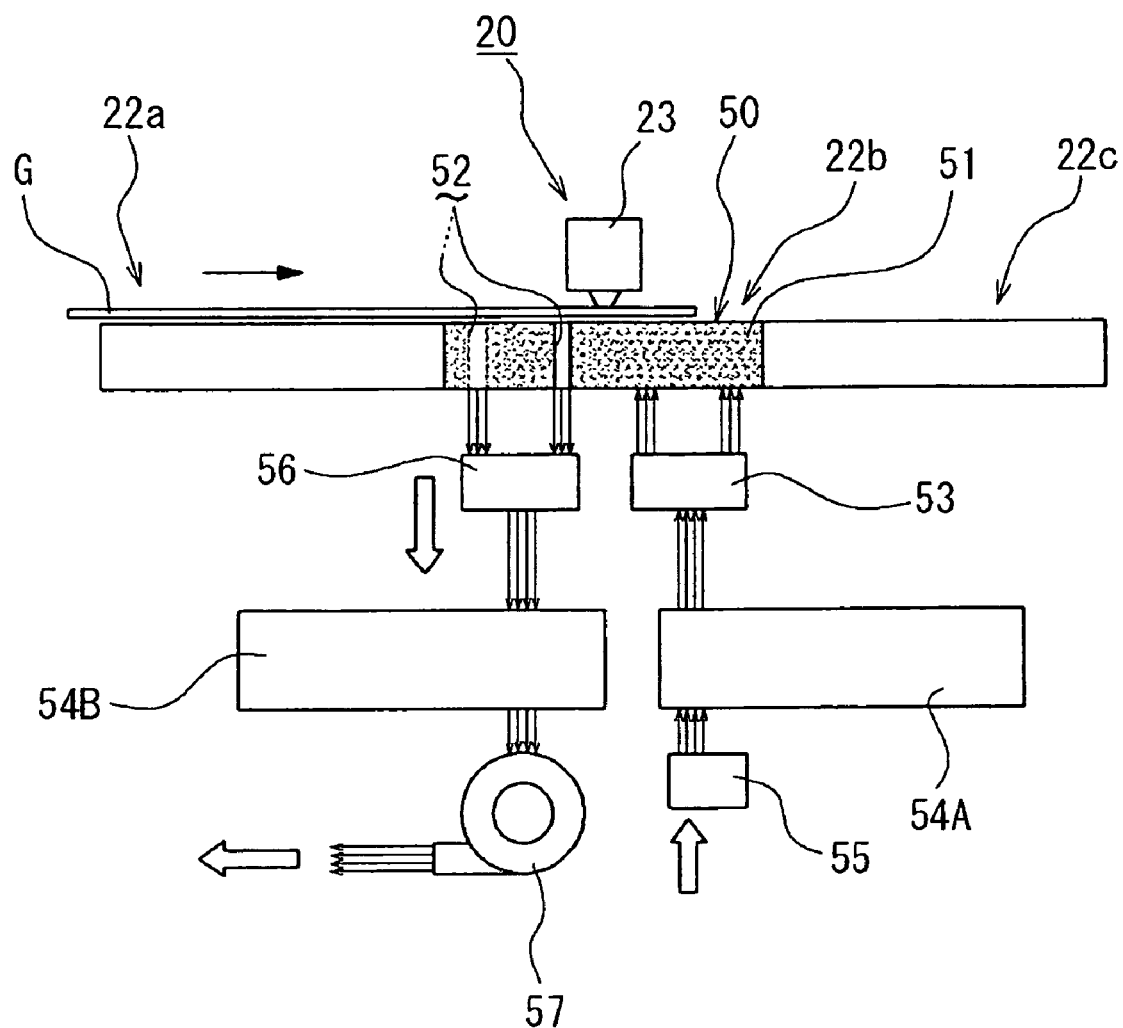
FIG. 3 is a schematic diagram showing the configuration of a first embodiment of the floating-type substrate conveying and processing apparatus.
Figure 4:
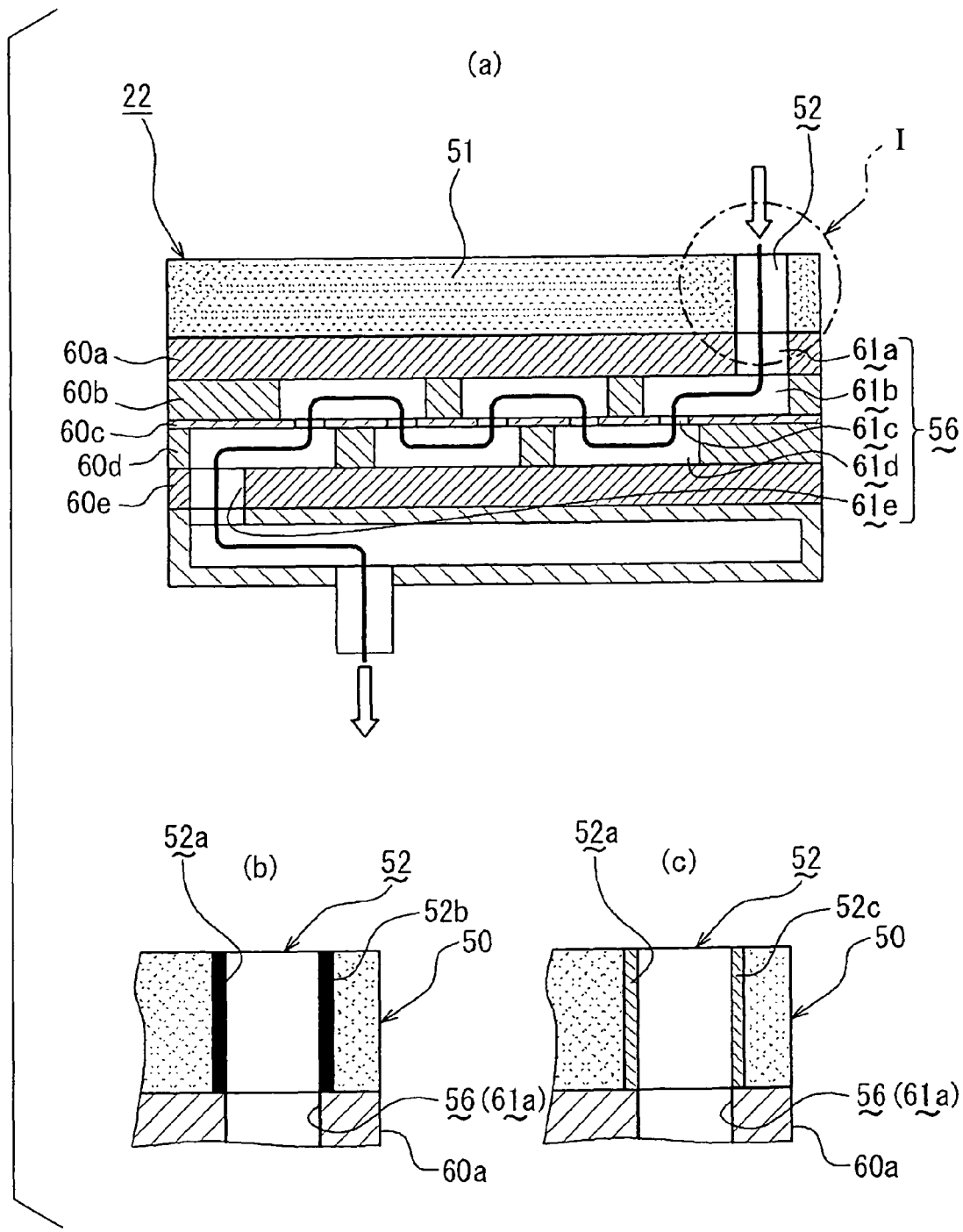
FIG. 4 is a diagram showing a sucking section in the first embodiment of the floating-type substrate conveying and processing apparatus, wherein (a) is a sectional view of an essential part of the sucking section, (b) is an enlarged sectional view of a part I in (a), and (c) is another enlarged sectional view of the part I.
Figure 5:
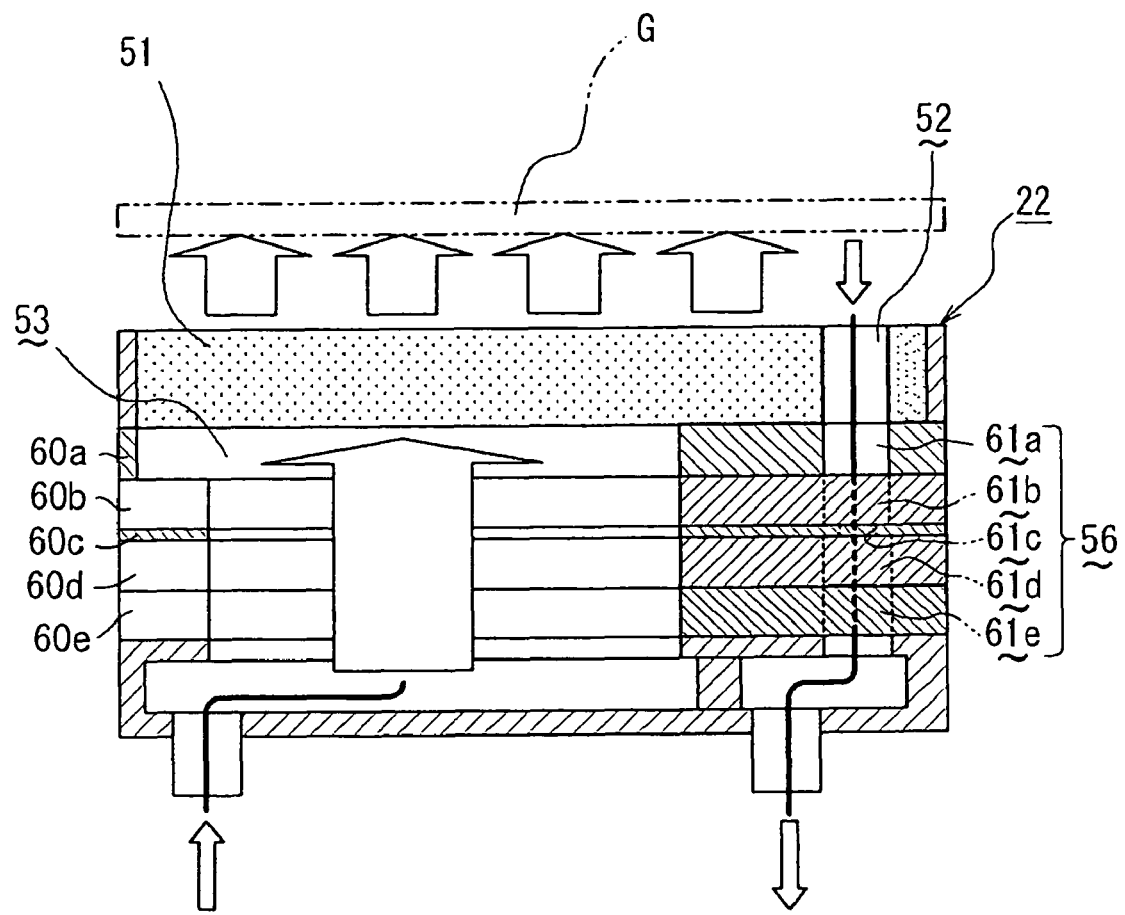
FIG. 5 is a sectional view showing an essential part of a supplying and sucking sections in the first embodiment of the floating-type substrate conveying and processing apparatus.

FIG. 2 is a schematic perspective view showing an essential part of a first embodiment of the resist applying apparatus 20. FIG. 3 is a schematic diagram showing how gas is supplied and sucked in the resist applying apparatus 20. FIGS. 4 and 5 are sectional views of an essential part of the resist applying apparatus 20, showing how gas is supplied and sucked.

The resist applying apparatus 20 consists mainly of: a floating stage 22 that injects gas, for example, air from its surface and sucks air to float the substrate G to any different height, a resist supply nozzle 23, placed above the floating stage 22, serving as a process liquid supplier to supply a resist liquid R, a process liquid, in band form to the surface of the substrate G; plural substrate holding members 24 that detachably suck and hold the opposite ends of the substrate G; a moving mechanism 28, for example, a linear motor that moves sliders 26 along guide rails 25 placed on the opposite sides of the floating stage 22 and parallel to each other; and couplers 27 each for coupling one of the substrate holding members 24 and the corresponding slider 26 together, the coupler 27 being displaceable so as to follow the floating height of the substrate G.

Figure 6:
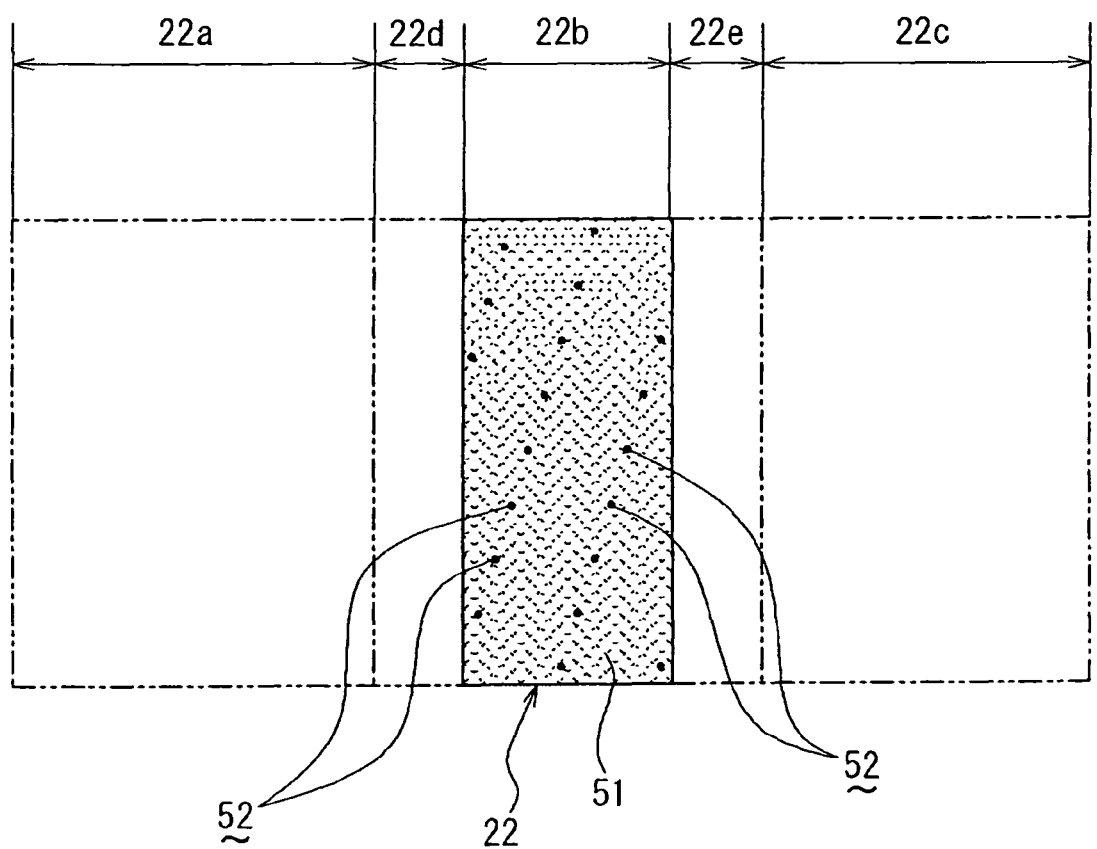
FIG. 6 is a schematic plan view showing a part of a floating stage according to the first embodiment of the floating-type substrate conveying and processing apparatus.

In this case, as shown in FIGS. 2 and 6, the floating stage 22 is provided with: a loading area 22a having plural, for example, four lift pins 28a that can go up and down to receive the substrate G conveyed by a conveying arm (not shown); an applying area 22b that keeps the distance between the resist supply nozzle 23 and the substrate G at a constant value, for example, 100 to 150 µm; and an unloading area 22c including plural, for example, four lift pins 28b that can go up and down to deliver the substrate G.

The floating stage 22 is formed of a porous member 50 made of stainless steel or aluminum and having a large number of gas supply apertures (gas injection apertures). The porous member 50 includes a porous section 51 having gas supply apertures and plural airtightly defined suction apertures 52. In this case, each of the suction holes 52 is formed by applying a coating 52b to an inner surface of a hole portion 52a drilled in the porous portion 51, as shown in (b) in FIG. 4, or inserting, for example, a synthetic resin tube 52c through the inner surface of the hole portion 52a drilled in the porous section 51, as shown in (c) in FIG. 4. The plural apertures 52 are inclined to a substrate conveying direction (direction X) and to a direction (direction Y) orthogonal to the conveying direction. The diameter of each of the plural suction apertures 52 has an average value of, for example, 1 mm to 3 mm.

The applying area 22b will be specifically described. The porous section, that is, the gas supply aperture section, of the porous member 50 connects to an air supplier 55, for example, a compressor, via a gas supply channel 53 formed on a bottom surface of the porous member 50 and an accumulator 54A that reduces pulsing. The suction apertures 52 connect to a vacuum pump 57 serving as a suction mechanism, via a bypass channel 56 formed on the bottom surface of the porous member 50 and an accumulator 54B that reduces pulsing (see FIGS. 3 to 5).

Figure 7:
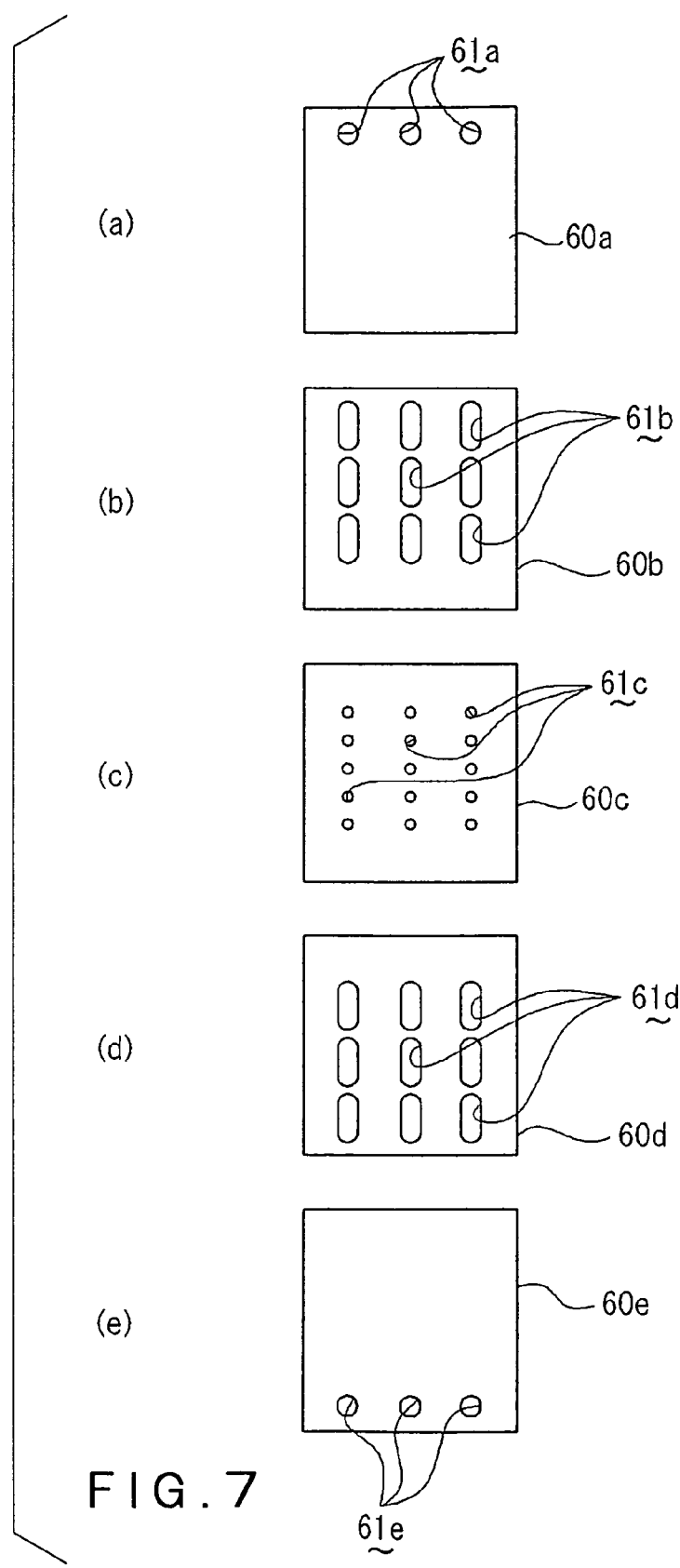
FIG. 7 is a schematic plan view showing plural plates constituting a bypass channel according to the present invention.

The gas supply channel 53 and bypass channel 56 are formed of hole portions provided in plural (for example, five) stacked plate materials (plates) 60a to 60e. In this case, as shown in FIG. 7, the bypass channel 56 is formed by stacking a first plate 60a, a second plate 60b, a third plate 60c, a fourth plate 60d, and a fifth plate 60e, and fixing these plates to one another by bolting or pressure bonding. The first plate 60a has plural (in the drawings, three) hole portions 61a spaced at appropriate intervals in a direction orthogonal to the sheet of FIG. 4. The second plate 60b has plural (in the drawing, 3×3=9) slot portions 61b arranged in the same rows as those of the hole portions 61a. The third plate 60c has plural (in the drawing, 3×5=15) small hole portions 61c arranged in the same rows as those of the hole portions 61a and slot portions 61b. The fourth plate 60d has plural (in the drawing, 3×3=9) slot portions 61d arranged slightly offset, across the row, from the slot portions 61b in the second plate 60b. The fifth plate 60e has plural (three) hole portions 61e formed at symmetric positions with respect to the hole portions 61a in the first plate 60a.

With the floating stage 22 configured as described above, when the compressor 55 and vacuum pump 57 are driven, air is distributedly injected upward as a result of pressure loss caused by the large number of gas supply apertures formed in the porous section 51 of the porous member 50 via the gas supply channel 53. The air is also sucked through the suction apertures 52 via the bypass channel 56. Thus, the substrate G floats over the floating stage 22. The substrate is conveyed from the loading area 22a to the applying area 22b and then to the unloading area 22c, by the linear motor 28. On this occasion, the air supplied is distributed by pressure loss caused through the porous section 51, whereas the sucked air is subjected to pressure loss caused through the bypass channel 56. This balances the supply (injection) with the suction. This in turn makes it possible to maintain the uniform floating height of the substrate G, to stably hold the floating substrate G, and to reduce vibration of the substrate G being conveyed. Further, since the suction apertures 52 are inclined to the substrate G conveying direction (direction X) and to the direction (direction Y) orthogonal to the conveying direction, it is possible to suppress possible stripes or nonuniformities (resist applied tracks) on a coating film on the substrate G and to further reliably reduce vibration of the substrate G being conveyed. In other words, the arrangements of the suction apertures 52 as inclined to the substrate G conveying direction (direction X) enables the suppression of stripes or nonuniformities on a coating film on the substrate G. Specifically, if the suction apertures 52 were arranged in the direction X, they would pass on one straight line to vary temperature distribution, resulting in stripes or nonuniformities. However, the arrangements of the suction apertures 52 as inclined to the direction X distributes the locations of the suction apertures 52 within the substrate surface. This suppresses possible stripes or nonuniformities. Further, if the suction apertures 52 were arranged in the direction (direction Y) orthogonal to the substrate conveying direction, an end of the substrate G would cover plural suction apertures 52 at a time, or when the substrate G leaves these suction apertures 52, its end would leave the apertures 52 at a time, the substrate G being vibrating in the vertical direction (direction Z). These problems can be solved by arrangements of the suction holes 52 as inclined to the Y direction.

In this case, in the loading area 22a and unloading area 22c, the substrate G floats at a height of about 100 to 150 µm. In the applying area 22b, the substrate G floats at a height of about 50 µm. Bridging areas 22d and 22e are formed between the loading area 22a and applying area 22b and between the applying area 22b and unloading area 22c to bridge the height gap between these areas. In the bridging areas 22d and 22e, the amounts of air injected and sucked are adjusted to gradually elevate or lower the substrate G.

The resist supply nozzle 23 is fixed to a gate-shaped frame (not shown) that extends over the floating stage 22. The resist supply nozzle 23 supplies (ejects or drops) a resist liquid R in band form to the surface of the substrate G while the resist liquid is being supplied through a supply pipe 23a connected to a resist tank (not shown).

The substrate holding member 24 includes plural suction pads and vacuum pipes (not shown) that detachably suck and hold the opposite ends of the substrate G. The substrate G can thus be detachably held using a vacuum device (not shown).

Each coupler 27 is, for example, a leaf spring member which couples the suction pads of one of the substrate holding members 24, to the corresponding slider 26 and which is displaceable so as to follow the floating height of the substrate G. In this case, the leaf spring member has its spring constant set so as to exert a spring force weaker than the force applied by each substrate holding member 24 to hold the substrate G, that is, the sucking force of the suction pads. Thus setting the spring constant of the leaf spring member enables the substrate holding member 24 to be displaced so as to follow the floating height of the substrate G with the holding force (sucking force) of the substrate holding member 24 maintained. Instead of the suction pads, the substrate holding member 24 may have, for example, electrostatic pads each of which applies a voltage to an internal metal electrode to generate positive and negative charges on the surfaces of the substrate G and electrostatic pad so that a Johnsen-Rahbek force acting between the positive and negative charges allows the substrate G to be sucked and held. Each coupler 27 may be a magnet instead of the leaf spring member.

Now, description will be the operational aspect of the resist applying apparatus 20 configured as described above. First, the substrate G thermally treated by the thermal treatment unit (TB) 31 is loaded onto the loading area 22a of the floating stage 22 by a conveying arm (not shown). The lift pins 28a then rise to receive the substrate G. The conveying arm subsequently moves from the floating stage 22 to the outside. The lift pins 28a lower upon receiving the substrate G. With descent of the lift pins 28a, the substrate G is floated at a height of about 100 to 150 µm due to the balance, in the loading area 22a, between the supply (injection) of air by the porous section 51 of the floating stage 22 and the suction of air through the suction apertures 52. Under these conditions, the vacuum device is actuated to allow the suction pads on the substrate holding members 24 to suck and hold the substrate G. On this occasion, the leaf spring members absorb the height gap between the floating substrate G and the sliders 26. The substrate G is thus maintained horizontally at a height of about 100 to 150 µm from the loading area 22a of the floating stage 22.

The linear motor 28 is then driven to convey the substrate G to the applying area 22b. In the application area 22b, the substrate G is floated at a height of about 50 µm due to the balance between the supply (injection) of air by the porous section 51 of the floating stage 22 and the suction of air through the suction apertures 52. On this occasion, the leaf spring members absorb the height gap between the floating substrate G and the sliders 26. The substrate G is thus maintained horizontally at a height of about 50 µm from the applying area 22b of the floating stage 22. This serves to maintain a predetermined gap (100 to 150 µm) between the substrate G and the resist supply nozzle 23. Under these conditions, the resist supply nozzle 23 supplies (ejects) a resist liquid R in band form, while the substrate G is moved. A resist film is thus uniformly formed on the surface of the substrate G.

The substrate G on which the resist film has been formed is moved to the unloading area 22c. The substrate G is then floated at a height of about 100 to 150 µm due to the balance, in the unloading area 22c, between the supply (injection) of air by the porous section 51 of the floating stage 22 and the suction of air through the suction apertures 52. Under these conditions, the vacuum device is stopped to release the sucked and held substrate G. The lift pins 28b then rise to move the substrate G to an upper delivery position. Under these positions, the conveying arm (not shown) receives the substrate G to convey it to the vacuum drying device (VD) 21 for the next step.

Second Embodiment

Figure 9:
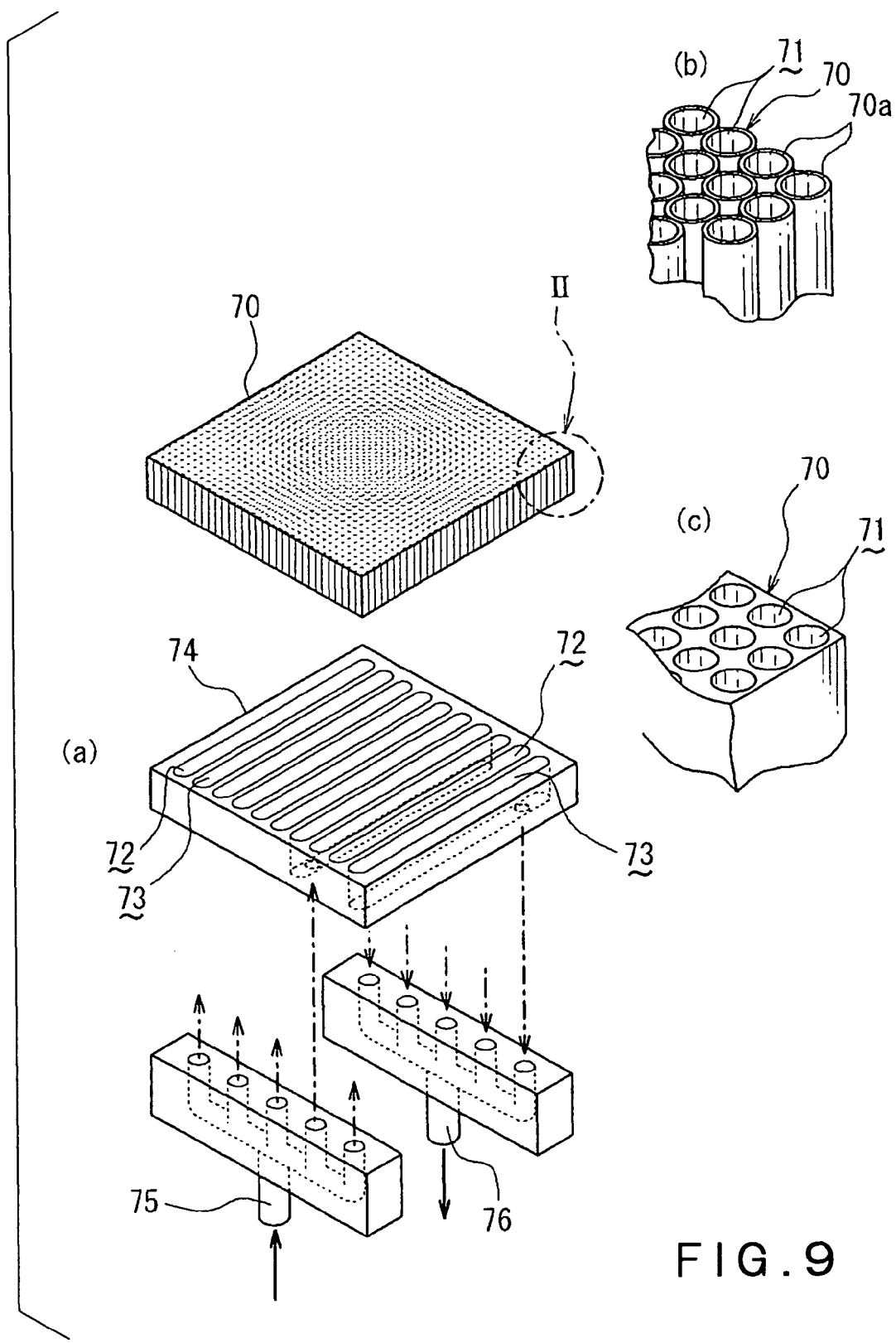
FIG. 9 is a diagram showing the components of the floating stage according to the second embodiment, wherein (a) is an exploded perspective view, (b) is an enlarged perspective view of a part II in (a), and (c) is another enlarged perspective view of the part II.

FIG. 8 is a schematic sectional view showing an essential part of a second embodiment of a floating-type substrate conveying and processing apparatus according to the present invention. In FIG. 9, (a) is an exploded perspective view of an essential part of the second embodiment showing a gas (air) supplying and sucking section, (b) is an enlarged perspective view showing a portion II in (a), and (c) is an enlarged perspective view showing the portion II in (a).

In the second embodiment, a floating stage 22A includes a porous plate 70 having a large number of small aligned apertures 71, and a channel plate 74 disposed on a bottom surface of the porous plate 70 and having alternately arranged gas supply channel grooves 72 and gas suction channel grooves 73. A compressor 55, serving as a gas supply mechanism, is connected to the gas supply channel grooves 72 via a supply line 75. A vacuum pump 57, serving as a suction mechanism, is connected to the gas suction channel grooves 73 via a suction line 76.

In the second embodiment, like the first embodiment, an accumulator 54A is provided on a secondary side (ejection side) of the compressor 55 on the supply line 75. An accumulator 54B is provided on a primary side (suction side) of the vacuum pump 57 on the suction line 76. In this case, as shown in, for example, (b) in FIG. 9, the porous plate 70 can be formed by collectively bonding a large number of tube members 70a together. Alternatively, the porous plate 70 having the large number of small aligned apertures 71 can be produced with, for example, a binder that binds wires that are melted (removed) by heat or chemicals, followed by melting (removing) the wires to leave the binder, as shown in (c) in FIG. 9.

In the floating-type substrate conveying and processing apparatus of the second embodiment configured as described above, the gas supply channel grooves 72 and gas suction channel grooves 73 may be arbitrarily arranged provided that they are alternately arranged. However, preferably, the gas supply channel grooves 72 and gas suction channel grooves 73 are inclined to the substrate G conveying direction (direction X) and to the direction (direction Y) orthogonal to the conveying direction, as shown in (a) in FIG. 10, or are corrugated along the directions X and Y, as shown in (b) in FIG. 10. Alternatively, preferably, the gas supply channel grooves 72 and gas suction channel grooves 73 are composed of straight main grooves 72a and 73a, respectively, extending in the direction Y and plural branch grooves 72b and 73b, respectively, extending in the direction X from the straight main grooves 72a and 73a, respectively. Further, the branch grooves 72b and 73b of the gas supply channel groove 72 and gas suction channel groove 73, respectively, that are adjacent to each other preferably arranged in a zigzag pattern, as shown in (c) in FIG. 10.

The second embodiment is the same as the first embodiment in the other respects. Accordingly, the same components are denoted by the same reference numerals, with their description omitted.

With the floating stage 22A of the second embodiment configured as described above, the compressor 55 and vacuum pump 57 are driven to distributedly inject air upward as a result of pressure loss caused by the large number of apertures 71, formed in the porous plate 70, via the gas supply channel grooves 72. The air is also sucked through the large number of apertures 71, formed in the porous plate 70, via the gas suction channel grooves 73. The gas supply channel grooves 72 and gas suction channel grooves 73 have a groove width of, for example, 2 mm to 20 mm. The apertures 71 have a diameter of, for example, 0.1 µm to 100 µm on average. Thus, the supply (injection) and suction of air are balanced by pressure loss caused by the large number of apertures 71, formed in the porous plate 70. This makes it possible to maintain the uniform floating height of the substrate G, to stably hold the floating substrate G, and to reduce vibration of the substrate G being conveyed.

Figure 10:
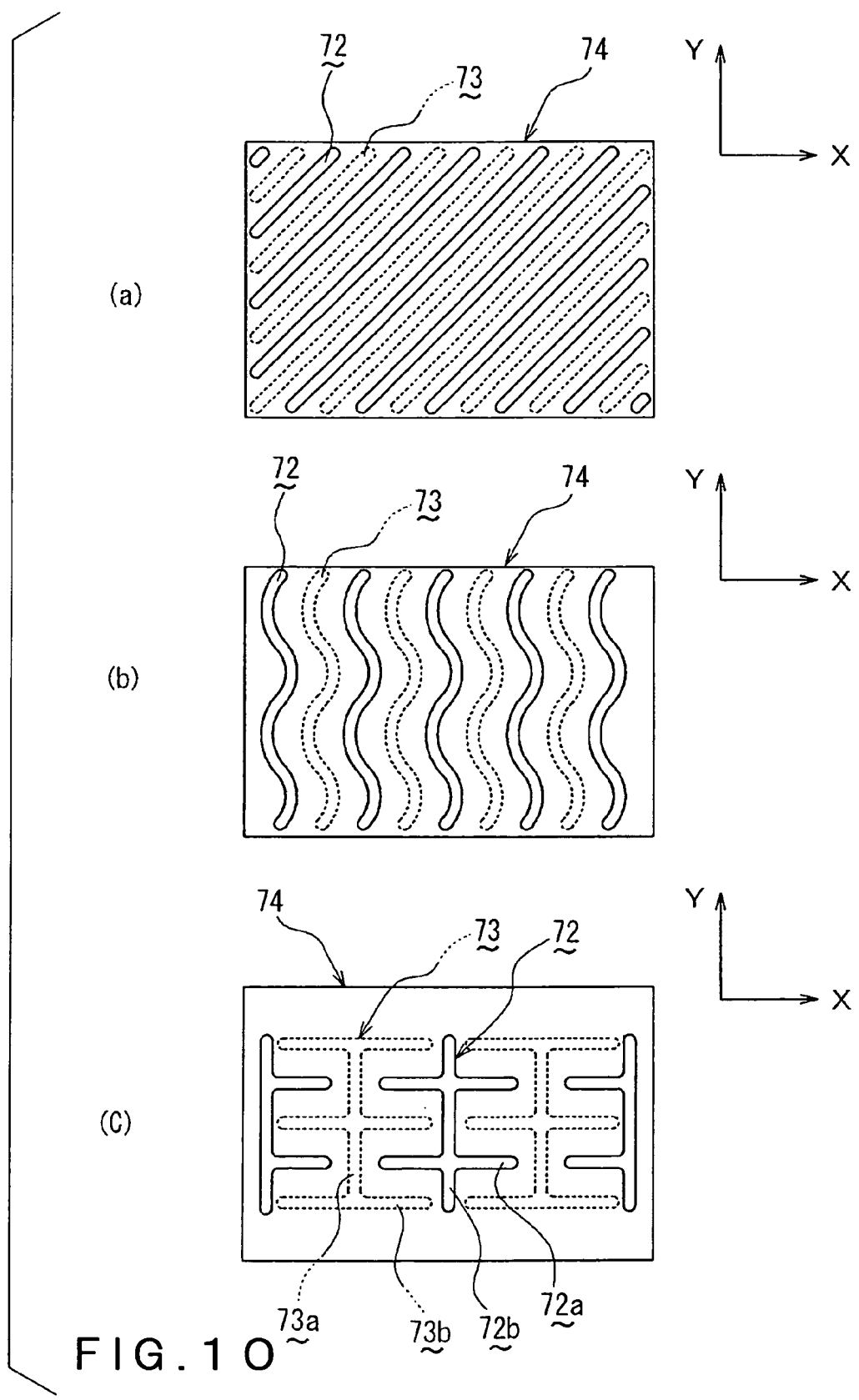
FIG. 10 is a schematic plan view showing a modification to gas supply channel grooves and gas suction channel grooves according to the second embodiment.

Vibration of the substrate G being conveyed can be further reliably reduced in the following ways: the gas suction channel grooves 73 are inclined to directions X and Y, as shown in (a) in FIG. 10, or are corrugated along the directions X and Y, as shown in (b) in FIG. 10, or the gas supply channel grooves 72 and gas suction channel grooves 73 are composed of straight main grooves 72a and 73a, respectively, extending in the direction Y and plural branch grooves 72b and 73b, respectively, extending in the direction X from the straight main grooves 72a and 73a, respectively, and the branch grooves 72b and 73b of the gas supply channel groove 72 and gas suction channel groove 73 that are adjacent to each other are arranged in a zigzag pattern, as shown in (c) in FIG. 10.

Third Embodiment

Figure 11:
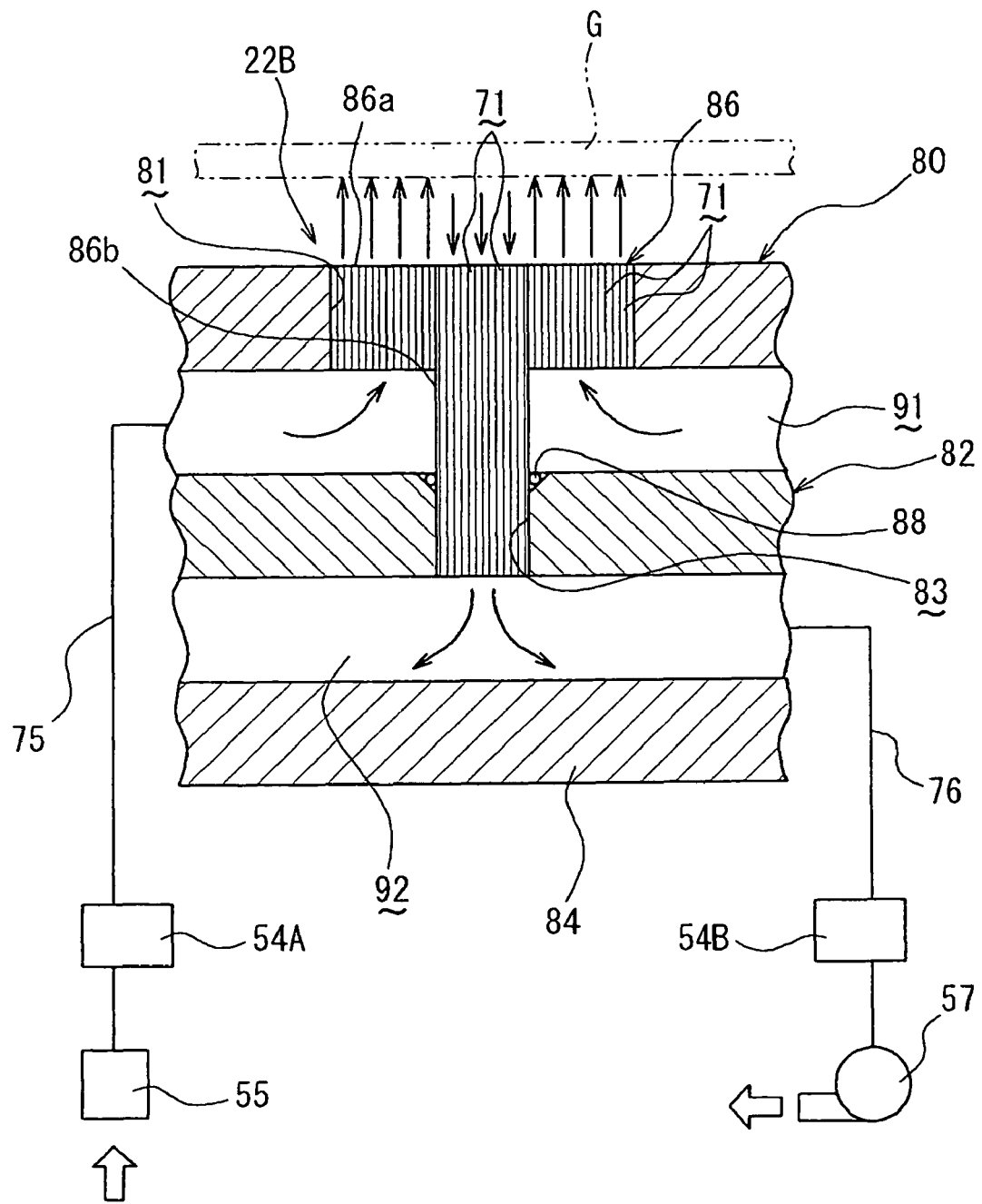
FIG. 11 is a schematic sectional view showing an essential part of a third embodiment of a floating-type substrate conveying and processing apparatus according to the present invention.
Figure 12:
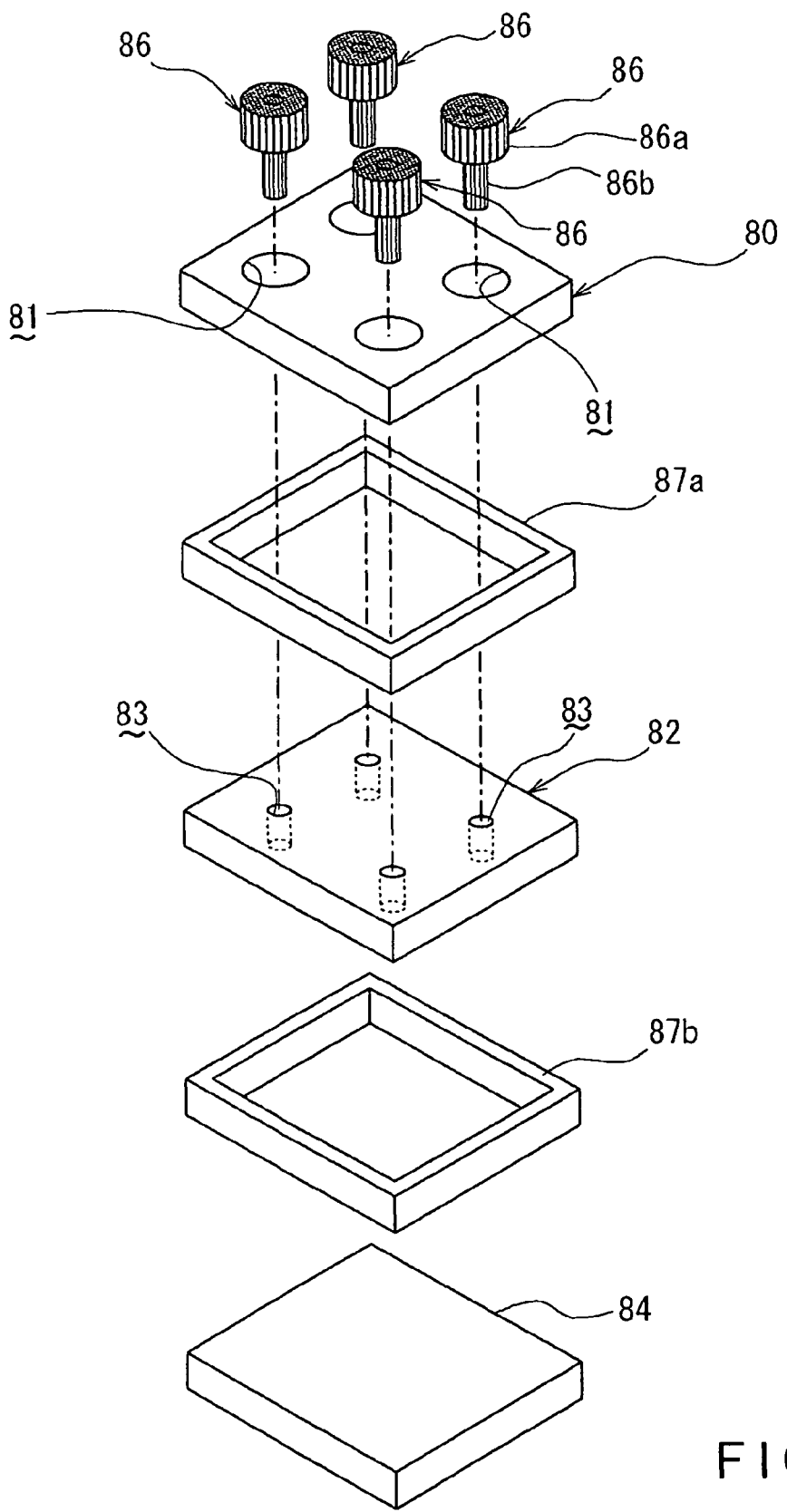
FIG. 12 is an exploded perspective view showing the components of a floating stage according to the third embodiment.

FIG. 11 is a schematic sectional view showing an essential part of a third embodiment of a floating-type substrate conveying and processing apparatus according to the present invention. FIG. 12 is an exploded perspective view of an essential part of the third embodiment showing a gas (air) supplying and sucking section.

In the third embodiment, a floating stage 22B consists of: a stage main body having a surface plate 80 having plural large-diameter holes 81, an intermediate plate 82 disposed below a bottom surface of the surface plate 80 via a first space 91 and having small-diameter holes 83 located immediately below the large-diameter holes 81, and a lower plate 84 disposed below a bottom surface of the intermediate plate 82 via a second space 92; and porous members 86 each having a large number of small aligned apertures 71 and airtightly fitted into the small-diameter holes 83. A compressor 55, serving as a gas supply mechanism, is connected to one of the first and second spaces 91 and 92, for example, the first space 91. A vacuum pump 57, serving as a suction mechanism, is connected to the other space, for example, the second space 92. An upper frame 87a having the first space 91 is interposed between the surface plate 80 and the intermediate plate 82. A lower frame 87b having the second space 92 is interposed between the intermediate plate 82 and the lower plate 84, as shown in FIG. 12.

As shown in FIGS. 11 and 12, each of the porous members 86 has a substantially T-shaped cross section having a large-diameter head portion 86a fitted into the corresponding large-diameter hole 81, formed in the surface plate 80, and a leg portion 86b airtightly fitted into the corresponding small-diameter hole 83, formed in the intermediate plate 82, via a sealing member, for example, an O-ring 88. Each of the porous members 86 need not necessarily have a substantially T-shaped cross section but may have, for example, a substantially inverse L-shaped cross section in which the leg portion 86b hangs down from one end of the large-diameter head portion 86a. The large-diameter hole 81 has a diameter of, for example, about 20 mm, and the small-diameter hole has a diameter of, for example, about 5 mm. The large number of small apertures 71, formed in the porous members 86, have a diameter of, for example, 0.1 to 100 µm on average.

The accumulator 54A is provided on the secondary side (ejection side) of the compressor 55 on the supply line 75, which connects the first space 91 and the compressor 55 together. The accumulator 54B is provided on the primary side (suction side) of the vacuum pump 57 on the suction line 76, which connects the second space 92 and the vacuum pump 57 together. In this case, like the porous plate 70 in the second embodiment, each porous member 86 can be formed by collectively bonding a large number of tube members together. Alternatively, the porous member 86 with the large number of small aligned apertures 71 can be produced with, for example, a binder that binds wires that are melted (removed) by heat or chemicals, followed by melting (removing) the wires to leave the binder.

The third embodiment is the same as the first and second embodiments in the other respects. Accordingly, the same components are denoted by the same reference numerals, with their description omitted.

With the floating stage 22B of the third embodiment configured as described above, the compressor 55 and vacuum pump 57 are driven to distributedly supply (inject) air upward as a result of pressure loss caused by the large number of small apertures 71, formed in the porous members 86, via the first space 91. The air is also sucked through the large number of small apertures 71, formed in the porous members 86, via the second space 92. On this occasion, the supply (injection) and suction of air are balanced by pressure loss caused by the large number of small apertures 71, formed in the porous members 86. This makes it possible to maintain the uniform floating height of the substrate G, to stably hold the floating substrate G, and to reduce vibration of the substrate G being conveyed.

In the above description, the compressor 55 is connected to the first space 91, whereas the vacuum pump 57 is connected to the second space 92. However, this may be inversed. That is to say, the vacuum pump 57 may be connected to the first space 91, with the compressor 55 connected to the second space 92.

Other Embodiments

In the description of the above embodiment, the floating-type substrate conveying and processing apparatus according to the present invention is applied to the resist applying apparatus. However, the flowing substrate conveying process device is also applicable to apparatuses other than the resist applying apparatus, for example, a developing apparatus.

The present invention employs the suction holes inclined to a substrate conveying direction and to the direction orthogonal to the conveying direction. This enables the suppression of a variation in suction force exerted during conveyance of a substrate to be processed. This in turn makes it possible to further improve the uniformity of the floating height, floating rigidity, and the level of vibration suppression.

According to the present invention, both supply and suction of gas are distributed by pressure loss caused by a large number of small aligned apertures. The balanced air supply and suction makes it possible to float a substrate while suppressing pulsing of air injection and suction. This makes it possible to maintain the uniform floating height of the substrate, to accomplish floating rigidity sufficient to stably hold the floating substrate, and to reduce vibration of the substrate being conveyed.

The present invention can also suppress a variation in suction force exerted during conveyance of a substrate to be processed. This makes it possible to further improve the uniformity of the floating height, floating rigidity, and the level of vibration suppression.

What is claimed is:

1. A floating-type substrate conveying and processing apparatus comprising:
   a floating stage formed of a porous member and including a plurality of suction apertures airtightly defined in a porous portion of the porous member, the floating stage injecting gas through the porous portion and sucking gas through the suction apertures to float a substrate to be processed placed on the porous portion, the suction apertures being arranged in rows, the rows being inclined with respect to a substrate conveying direction, which substrate conveying direction is parallel to the floating stage, and the rows being inclined with respect to a direction that is both parallel to the floating stage and transverse to the substrate conveying direction;
   a process liquid supplier placed above the floating stage via the substrate to supply a process liquid to a surface of the substrate; and
   a moving mechanism to hold the substrate as detachable at opposite ends of the substrate, at a floating height of the substrate, and to move the substrate on the floating stage in the substrate conveying direction.

2. The floating-type substrate conveying and processing apparatus according to claim 1, further comprising:
   a gas supply mechanism connected to the porous portion of the floating stage; and
   a suction mechanism connected to the suction apertures in the floating stage via a bypass channel.

3. The floating-type substrate conveying and processing apparatus according to claim 1, wherein the floating stage includes at least a first plate including a plurality of first holes and a second plate including a plurality of second holes, the second plate being stacked on the first plate, in which the first holes are arranged on the first plate at a first predetermined interval and the second holes are arranged on the second plate at a second predetermined interval so that the second holes overlap the first holes to form bypass channels through which the gas sucked through the suction apertures is sucked.

4. A floating-type substrate conveying and processing apparatus comprising:
   a floating stage including
      a stage main body having a surface plate with a plurality of first holes,
      an intermediate plate disposed below a bottom surface of the surface plate via a first space and located immediately below each of the first holes, the intermediate plate having second holes smaller than the first holes, and
      a lower plate disposed below a bottom surface of the intermediate plate via a second space,
      porous members each having a plurality of aligned apertures smaller than the second holes,
      a head portion that is fitted into a corresponding first hole, and
      a leg portion located below the head portion and which is airtightly fitted into a corresponding second hole, the floating stage injecting gas through the porous members and sucking gas through the porous members to float a substrate to be processed placed on the surface plate;
   a process liquid supplier placed above the floating stage via the substrate to supply a process liquid to a surface of the substrate; and
   a moving mechanism to hold the substrate as detachable at opposite ends of the substrate, at a floating height of the substrate, and for moving the substrate on the floating stage in a substrate conveying direction that is parallel to the floating stage.

5. The floating-type substrate conveying and processing apparatus according to claim 4, further comprising:
   a gas supply mechanism connected to either the first or the second space; and
   a suction mechanism connected to the other of the first and second space.

* * * * *